(12) United States Patent
Choi

(10) Patent No.: US 7,224,537 B2
(45) Date of Patent: May 29, 2007

(54) DIFFUSION LENS FOR DIFFUSING LED LIGHT

(75) Inventor: Soon Cheol Choi, Dongducheon-si (KR)

(73) Assignee: Sekonix Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/438,298

(22) Filed: May 23, 2006

(65) Prior Publication Data

US 2006/0262424 A1   Nov. 23, 2006

(30) Foreign Application Priority Data

May 23, 2005   (KR) .................. 10-2005-0042985

(51) Int. Cl.
G02B 13/20   (2006.01)
(52) U.S. Cl. ..................... 359/707; 359/709
(58) Field of Classification Search ............... 359/716, 359/708, 726, 709, 707
See application file for complete search history.

(56) References Cited

U.S. PATENT DOCUMENTS

2005/0111114 A1* 5/2005 Bode et al. .............. 359/707

* cited by examiner

Primary Examiner—Timothy Thompson
Assistant Examiner—Jerry Fang
(74) Attorney, Agent, or Firm—Sughrue Mion, PLLC

(57) ABSTRACT

Disclosed herein is a diffusion lens for diffusing LED light. The diffusion lens of the present invention includes a bottom surface, a conic first lens surface, a second lens surface, and a third lens surfaces. According to the present invention, it is easy to manufacture a mold required to manufacture a diffusion lens for diffusing LED light, and to eject the diffusion lens after molding has been performed, and it can uniformly diffuse LED light in the central direction, the diagonal direction and the lateral direction of the lens.

10 Claims, 5 Drawing Sheets

DIFFUSION LENS FOR DIFFUSING LED LIGHT

RELATED APPLICATIONS

The present disclosure relates to subject matter contained in priority Korean Application No. 10-2005-0042985 filed on 23 May 2005, which is herein expressly incorporated by reference in its entirety.

BACKGROUND OF THE INVENTION

1. Field of the Invention

The present invention relates, in general, to a diffusion lens for diffusing light emitted from a light emitting diode and, more particularly, to a diffusion lens for diffusing light emitted from a light emitting diode, which uniformly diffuses light that is emitted from a light emitting diode, employed as a light source for backlighting a liquid crystal display, in the central direction, the diagonal direction and lateral direction of the lens.

2. Description of the Related Art

A display device, lacking a function of emitting light by itself, such as a Liquid Crystal Display (LCD), must use a separate light source for backlighting. For this function, a fluorescent lamp, such as Cold Cathode Fluorescent Lamp (CCFL), is mainly used in the prior art. However, recently, the brightness and performance of a Light Emitting Diode (hereinafter referred to as an "LED") have been improved, and instances in which LEDs are applied for backlighting LCDs, have increased.

However, since an LED is a point light source that emits light from a single point, a diffusion lens (also called a "secondary lens") for diffusing light, emitted from an LED chip, is used to widen the illumination area and obtain uniform luminance in spite of the short distance between the LCD and the light source.

FIG. 1 illustrates the shape of a conventional diffusion lens for diffusing LED light, and the trace of the LED light.

As shown in FIG. 1, the conventional diffusion lens for diffusing LED light includes a bottom surface 10 for receiving an LED chip L, a first lens surface 20 upwardly inclined from the central axis of the lens, a second lens surface 30 extending from the outer end of the first lens surface 20 and downwardly inclined toward the central axis of the lens, and a third lens surface 40 curved from the lower end of the second lens surface 30 to the bottom surface.

First, in the bottom surface 10 of the lens, a receiving cavity 15 for receiving the LED chip L is formed, so that LED light is incident on the lens along the boundary surface of the recess.

The first lens surface 20 forms an inclined surface upwardly extending from the central axis (indicated by the dotted line) of the lens, and forms, together with the second lens surface 30, a funnel-shaped protruding surface. Accordingly, in a range adjacent to the central axis of the lens, LED light, having passed through the bottom surface 10, is incident on the first lens surface 20 at an angle lower than a critical angle of $\theta_c$, and is refracted in the central direction of the lens. In contrast, when the incidence angle of the LED light is equal to or greater than the critical angle, the LED light is totally reflected from the first lens surface 20, passes through the second lens surface 30, and is then diffused in the lateral direction of the lens.

As shown in FIG. 1, the second lens surface 30 and the third lens surface 40 form a depressed part on the side surface of the lens, and the LED light, directly incident on the second lens surface 30, is refracted from the second lens surface, and advances in the lateral direction of the lens.

Since the conventional diffusion lens has a very complicated shape, it is not practical to produce the diffusion lens by polishing and processing glass, so the diffusion lens is generally produced through injection using a plastic material as the material. However, there is a disadvantage in that, even if a plastic injection process is employed, it is difficult to eject a plastic lens from a mold after the molding of the plastic lens has been completed, because of the funnel-shaped protrusion and the depressed part on the side surface, and it is also not easy to produce the mold of the lens.

Further, since LED light incident on the first lens surface 20 is refracted to the top of the lens in a range adjacent to the central axis of the lens, or is totally reflected when the LED light is incident on a side surface compared to the central axis, it is difficult to adjust the amount of light of illumination passing through the center portion of the lens, using upper refracted light, refracted from the first lens surface. That is, most LED light incident on the first lens surface is totally reflected, and refraction is very limitedly conducted only around the central axis of the lens, so that a phenomenon in which the center portion of the lens is darker than the surrounding portion of the lens may easily occur.

SUMMARY OF THE INVENTION

Accordingly, the present invention has been made keeping in mind the above problems occurring in the prior art, and an object of the present invention is to provide the shape of a diffusion lens for diffusing LED light, which facilitates the ejection of the diffusion lens after the production of a mold and molding have been performed when the diffusion lens for diffusing LED light is produced, and which uniformly diffuses LED light in the central direction, the diagonal direction and the lateral direction of the lens.

In accordance with one aspect of the present invention to accomplish the above object, there is provided a diffusion lens for diffusing Light Emitting Diode (LED) light, comprising a bottom surface on which LED light is incident; a conic first lens surface upwardly protruded along a central axis of the lens, and adapted to totally reflect light, incident through the bottom surface, in a central direction of the lens; a second lens surface upwardly inclined from an outer end of the conic first lens surface, and adapted to totally reflect light, incident through the bottom surface, in a diagonal direction of the lens; and a third lens surface extending from an outer end of the second lens surface to the bottom surface, and refracting light, incident through the bottom surface, in a lateral direction of the lens.

Preferably, the first lens surface and the second lens surface may form a V-shaped inclined surface that is depressed toward a lower portion of the lens. Preferably, the conic first lens surface, which is upwardly protruded, has a curved surface-shaped center portion.

Preferably, the first lens surface and/or the second lens surface may be produced to have one of a linear shape and an aspheric shape. Preferably, the third lens surface may be downwardly and outwardly inclined from the outer end of the second lens surface to the bottom surface of the lens. Preferably, the bottom surface may have an LED receiving cavity that is formed to be depressed in parallel to the central axis of the lens and receives an LED.

In accordance with another aspect of the present invention to accomplish the above object, there is provided a luminous element assembly, the assembly including a semiconductor luminous element and a diffusion lens for diffusing light emitted from the luminous element, the diffusion lens comprising a bottom surface on which light emitted from the semiconductor luminous element is incident; a conic first lens surface upwardly protruded along a central axis of the lens, and adapted to totally reflect light, incident through the bottom surface, in a central direction of the lens; a second lens surface upwardly inclined from an outer end of the conic first lens surface, and adapted to totally reflect light, incident through the bottom surface, in a diagonal direction of the lens; and a third lens surface extending from an outer end of the second lens surface to the bottom surface, and refracting light, incident through the bottom surface, in a lateral direction of the lens.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
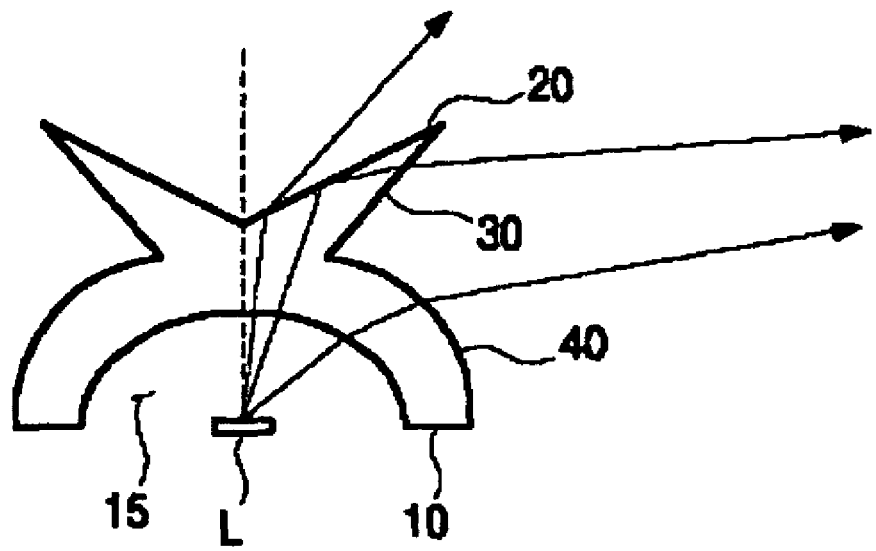
FIG. 1 is a diagram showing the shape of the section of a conventional diffusion lens for diffusing LED light, and the trace of LED light.

Hereinafter, embodiments of the present invention will be described in detail with reference to the attached drawings.

Reference now should be made to the drawings, in which the same reference numerals are used throughout the different drawings to designate the same or similar components.

Figure 2:
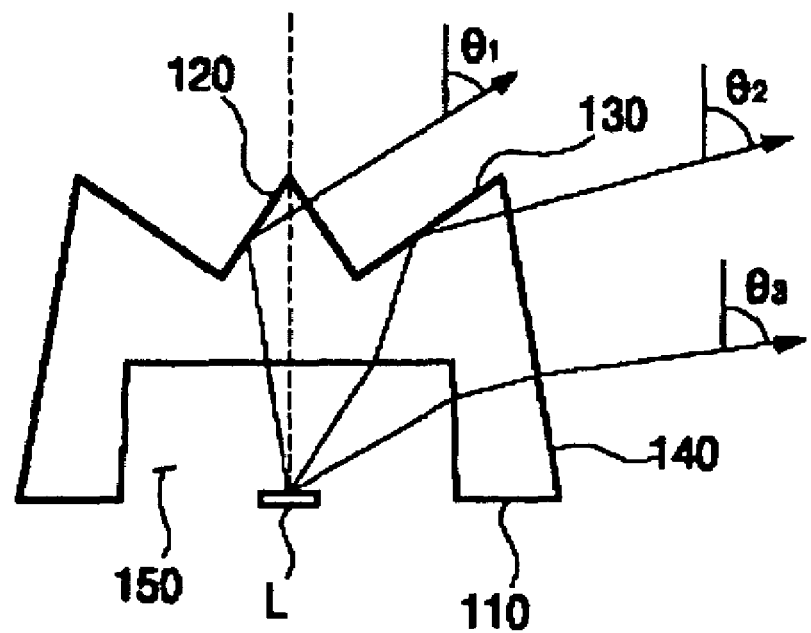
FIG. 2 is a diagram showing the shape of the section of a diffusion lens for diffusing LED light and the trace of LED light according to an embodiment of the present invention.

FIG. 2 illustrates the shape of a diffusion lens for diffusing Light Emitting Diode (LED) light and the diffusion trace thereof according to an embodiment of the present invention. As shown in FIG. 2, the diffusion lens for diffusing LED light can be packaged as a single luminous element assembly, together with an LED chip using a well-known method.

As shown in the drawing, the diffusion lens for diffusing LED light according to an embodiment of the present invention includes a bottom surface 110 on which LED light is incident, a conic first lens surface 120 upwardly protruded along the central axis of the lens, a second lens surface 130 upwardly inclined from the outer end of the conic first lens surface 120, and a third lens surface 140 corresponding to the side surface of the lens and extending from the outer end of the second lens surface 130 to the bottom surface.

First, in the bottom surface 110 of the lens, a receiving cavity 150 is formed in the center portion thereof to receive an LED chip L, and LED light is incident on the lens along the boundary surface of the receiving cavity. The receiving cavity 150 is formed such that it is depressed in parallel to the central axis (indicated by the dotted line) of the lens, and the ceiling surface of the receiving cavity is parallel to the bottom surface of the lens.

Figure 3:
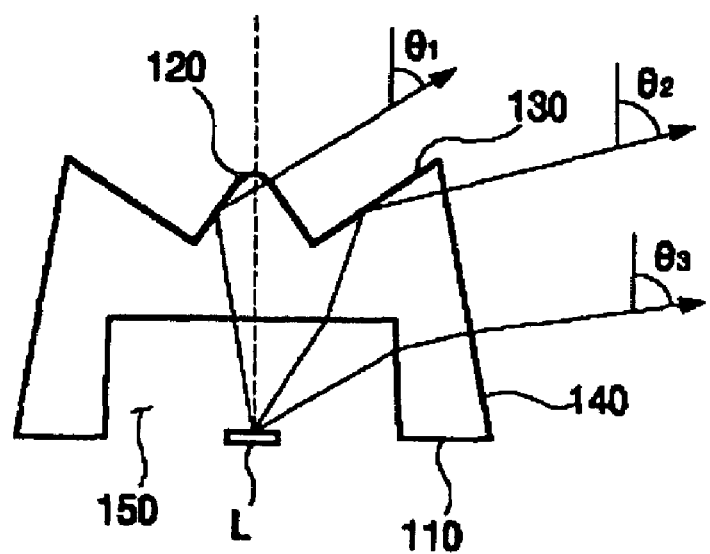
FIG. 3 is a diagram showing the shape of the section of a diffusion lens for diffusing LED light and the trace of LED light according to an alternative embodiment of the present invention.

The first lens surface 120 constitutes, together with the second lens surface 130, the top surface of the lens, and totally reflects light, incident through the bottom surface 110 around the central axis of the lens, in the central direction corresponding to the center portion of the lens. In FIG. 2, a shape in which the upwardly protruding center portion of the first lens surface 120 is sharp is shown, but, alternatively, the center portion of the first lens surface can be formed in the shape of a curved surface, as shown in FIG. 3.

The second lens surface 130 extends at a gentler slope than that of the first lens surface, and forms, together with the first lens surface 120, an asymmetrical V-shaped inclined surface that is depressed toward the lower portion of the lens. Light incident through the bottom surface of the lens is primarily refracted at the ceiling part of the receiving cavity 150, and is then totally reflected at the second lens surface. Through this structure, the LED light, advancing after being totally reflected at the second lens surface 130, is diffused in a diagonal direction, indicating the outer range of the diffusion range of light that is totally reflected from the first lens surface 120.

Since light incident on the second lens surface 130 has a greater incidence angle than that incident on the first lens surface 120, the second lens surface can be designed to have a gentler slope than the first lens surface. Accordingly, such a structure is advantageous to diffuse light at an angle greater than that of the light that is totally reflected from the first lens surface with respect to the central axis of the lens.

That is, when light incident on the first lens surface 120 is totally reflected at a first angle $\theta_1$ with respect to the central axis of the lens and then advances, light incident on the second lens surface 130 is totally reflected at a second angle $\theta_2$, which is greater than the first angle $\theta_1$ ($\theta_2 > \theta_1$), and can be diffused in the diagonal direction of the lens.

In FIG. 1, the first and second lens surfaces can be manufactured to have a linear shape. However, alternatively, all or part of the surfaces can be manufactured to have an aspheric shape.

Finally, the third lens surface 140 constitutes the side surface of the lens, and is downwardly and outwardly inclined from the outer end of the second lens surface to the bottom surface of the lens. Light incident on the third lens surface 140 is refracted in the lateral direction of the lens so that the incident light is diffused to a wider range than that of the light totally reflected from the second lens surface 130.

That is, light, incident on the lower portion of the third lens surface 140, is refracted at a third angle $\theta_3$, which is greater than the second angle $\theta_2$ ($\theta_3 > \theta_2$) with respect to the central axis of the lens, and then advances. If the third angle approaches 90 degrees, the refracted light advances to the side surface of the lens. Meanwhile, LED light to be refracted from the third lens surface 140 can be primarily refracted at the sidewall of the receiving cavity 150 in advance, and can be incident on the third lens surface, thus securing a greater refraction angle.

FIG. 2 illustrates only the section of the diffusion lens for diffusing LED light according to an embodiment of the present invention, but those skilled in the art will understand that a lens can be designed to have rotational symmetry, horizontal symmetry, and/or plane symmetry around the central axis of the lens. Further, with respect to the shape of the diffusion lens, the present invention can suitably distribute light to be diffused in the central direction, the diagonal direction and the lateral direction of the lens by adjusting the sizes and/or slopes of the first, second and third lens surfaces, thus uniformly diffusing light over an entire range.

Next, the advantages of the diffusion lens for diffusing LED light are described by applying actual numerical values to design parameters for the diffusion lens according to an embodiment of the present invention.

Figure 4:
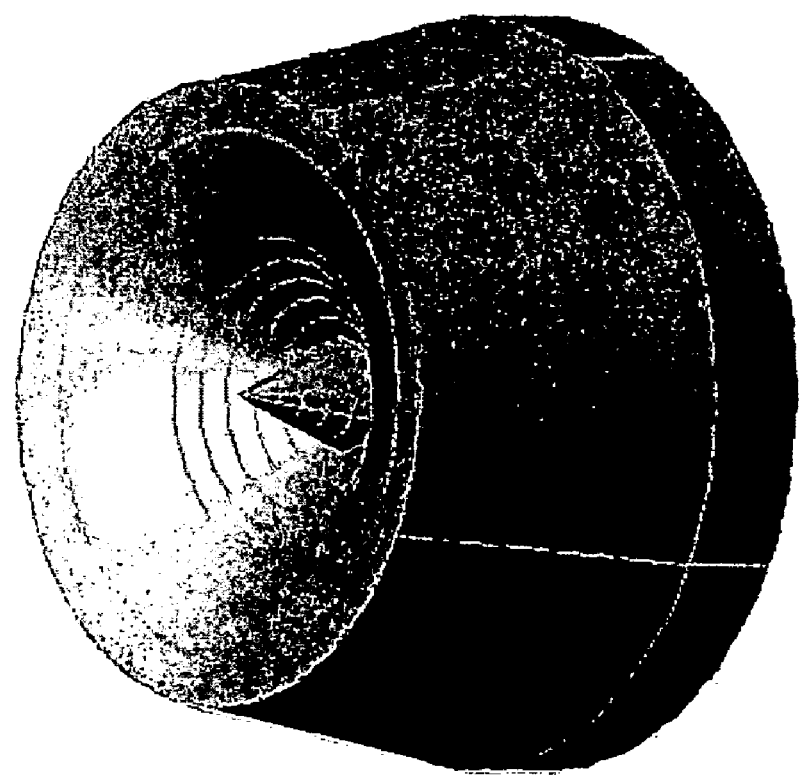
FIG. 4 is a three-dimensional perspective view of a diffusion lens for diffusing LED light according to an embodiment of the present invention.

FIG. 4 is a diagram showing the three-dimensional shape of the diffusion lens for diffusing LED light according to an embodiment of the present invention. The first and second lens surfaces of the diffusion lens are formed in aspheric shapes, and satisfy the aspheric equation given in the following Equation [1], as well known to those skilled in the art.

$$Z = \frac{H^2/R}{1 + \sqrt{1 - (1+k)(H^2/R^2)}} + AH^4 + BH^6 + CH^8 + DH^{10} \quad [1]$$

In this case, Z is sag, H is the height from an optical axis, R is the radius of curvature, k is a conic constant, and A, B, C and D are aspheric coefficients.

For example, when the distance between the luminous part of the LED and an LCD is assumed to be 25 mm, the first and second lens surfaces of FIG. 4 can be designed, as shown in Table 1, and the third lens surface can be designed to be inclined at an angle of 11 degrees with respect to the central axis of the lens.

TABLE 1

| Design parameter | first lens surface | second lens surface |
|---|---|---|
| R | 0.01 | −0.00001 |
| K | −1.1819 | −2.0 |
| A | 0.0 | $0.2 \times 10^{-1}$ |
| B | 0.0 | $-0.14 \times 10^{-2}$ |
| C | 0.0 | $0.35 \times 10^{-4}$ |
| D | 0.0 | 0.0 |

Figure 5A:
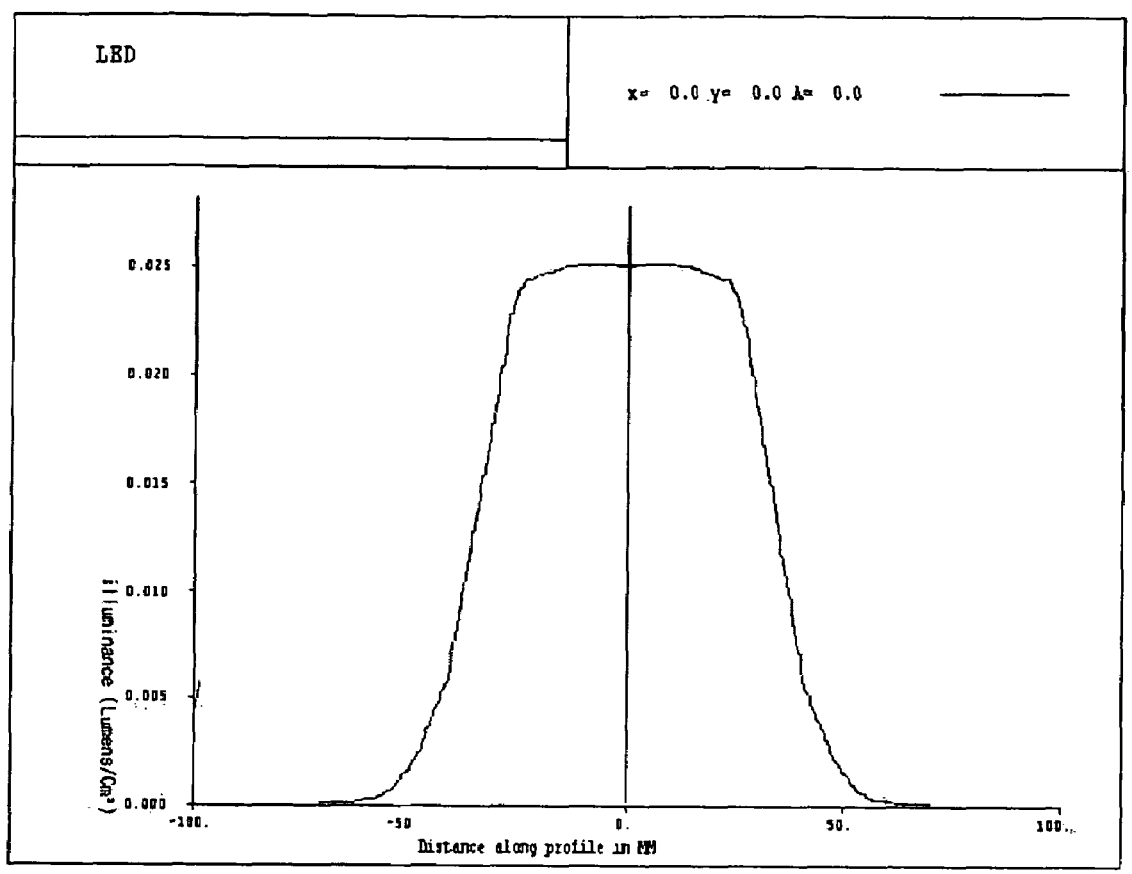
FIG. 5A is a graph showing the distribution of the amount of light obtained through the first lens surface of the diffusion lens for diffusing LED light according to an embodiment of the present invention.
Figure 5B:
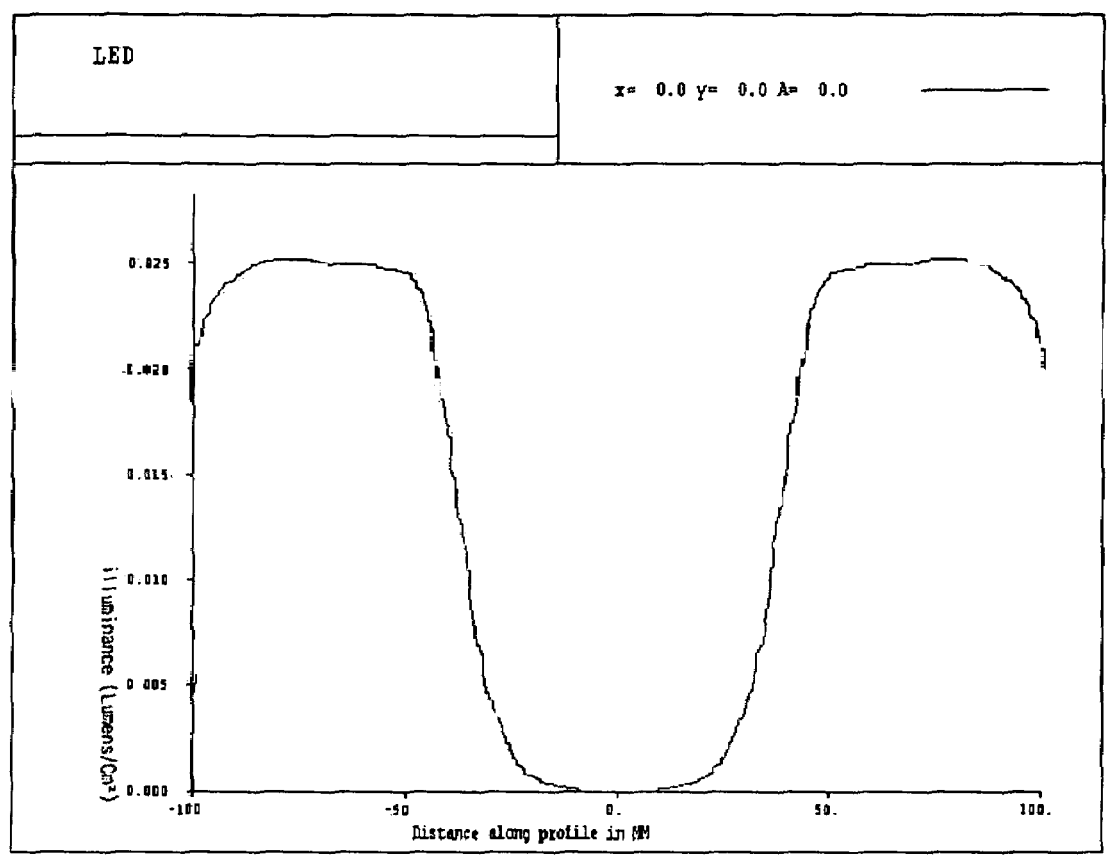
FIG. 5B is a graph showing the distribution of the amount of light obtained through the second and third lens surfaces of the diffusion lens for diffusing LED light according to an embodiment of the present invention.
Figure 5C:
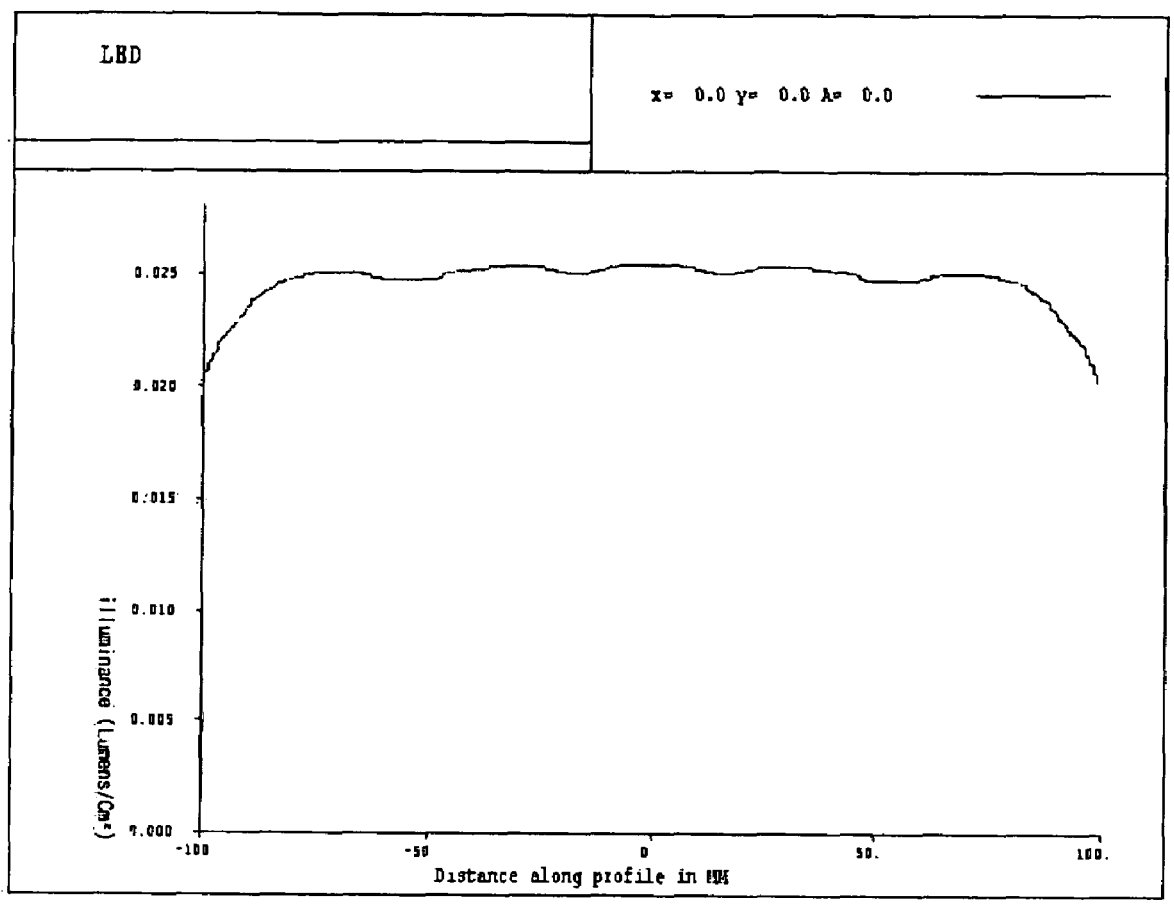
FIG. 5C is a graph showing the distribution of the amount of light obtained through all of the lens surfaces of the diffusion lens for diffusing LED light according to an embodiment of the present invention.

FIGS. 5A to 5C illustrate the distributions of the amount of light obtained through the first to third lens surfaces and all of the lens surfaces of the above-described diffusion lens for diffusing LED light in FIG. 4.

First, referring to FIG. 5A, light that is totally reflected from the first lens surface of the diffusion lens for diffusing LED light according to an embodiment of the present invention forms a uniform distribution of luminance of 0.025 Lumens/cm² within a range of 25 mm around the center portion of the lens, that is, that is, the central axis (optical axis) of the lens, and forms a distribution of luminance that suddenly decreases within a range of 25 to 50 mm around the central axis (optical axis) of the lens.

In contrast, as shown in FIG. 5B, light that is totally reflected from the second lens surface, and light that is refracted from the third lens surface, is diffused in the diagonal direction and the lateral direction of the lens. That is, light obtained through the second and third lens surfaces suddenly increases within a range of 25 to 50 mm around the central axis (optical axis) of the lens, and forms a uniform distribution of luminance of 0.025 Lumens/cm² within a range of 50 to 100 mm.

Finally, in all of the lens surfaces of the lens, the distributions of the amount of light, obtained through the first to third lens surfaces, overlap each other, as shown in FIG. 5C. Accordingly, it can be seen that light diffused in the central direction, the diagonal direction and the lateral direction of the lens is uniformly distributed.

As described above, since a diffusion lens for diffusing LED light according to the present invention is not provided with a depressed part on the side surface of a lens, unlike the structure of a conventional diffusion lens, it is easy to produce a mold required to manufacture a diffusion lens for diffusing LED light, and it is also simple to eject the lens after molding has been performed.

Further, the present invention is advantageous in that lens surfaces for diffracting LED light in the central direction and the lateral direction of the lens are separately provided, so that the adjustment of the amount of light of illumination passing through the center portion of the lens is facilitated, and the sizes or slopes of the first to third lens surface's provided by the shape of the lens are adjusted, thus uniformly diffusing light in the central direction, the diagonal direction and the lateral direction of the lens.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Therefore, the scope of the present invention should be defined by the accompanying claims.

What is claimed is:

1. A diffusion lens for diffusing Light Emitting Diode (LED) light, comprising:
   a bottom surface on which LED light is incident;
   a conic first lens surface upwardly protruded along a central axis of the lens, and adapted to totally reflect light, incident through the bottom surface, in a central direction of the lens;
   a second lens surface upwardly inclined from an outer end of the conic first lens surface, and adapted to totally reflect light, incident through the bottom surface, in a diagonal direction of the lens; and
   a third lens surface extending from an outer end of the second lens surface to the bottom surface, and refracting light, incident through the bottom surface, in a lateral direction of the lens.

2. The diffusion lens according to claim 1, wherein the first lens surface and the second lens surface form a V-shaped inclined surface that is depressed toward a lower portion of the lens.

3. The diffusion lens according to claim 1 or 2, wherein the conic first lens surface, which is upwardly protruded, has a curved surface-shaped center portion.

4. The diffusion lens according to claim 1 or 2, wherein the first lens surface is produced to have one of a linear shape and an aspheric shape.

5. The diffusion lens according to claim 1 or 2, wherein the second lens surface is produced to have one of a linear shape and an aspheric shape.

6. The diffusion lens according to claim 1 or 2, wherein the third lens surface is downwardly and outwardly inclined from the outer end of the second lens surface to the bottom surface of the lens.

7. The diffusion lens according to claim 1 or 2, wherein the bottom surface has an LED receiving cavity that is formed to be depressed in parallel to the central axis of the lens and receives an LED.

8. A luminous element assembly, the assembly including a semiconductor luminous element and a diffusion lens for diffusing light emitted from the luminous element, the diffusion lens comprising:
- a bottom surface on which light emitted from the semiconductor luminous element is incident;
- a conic first lens surface upwardly protruded along a central axis of the lens, and adapted to totally reflect light, incident through the bottom surface, in a central direction of the lens;
- a second lens surface upwardly inclined from an outer end of the conic first lens surface, and adapted to totally reflect light, incident through the bottom surface, in a diagonal direction of the lens; and
- a third lens surface extending from an outer end of the second lens surface to the bottom surface, and refracting light, incident through the bottom surface, in a lateral direction of the lens.

9. The luminous element assembly according to claim 8, wherein the first lens surface and the second lens surface form a V-shaped inclined surface that is depressed toward a lower portion of the lens.

10. The luminous element assembly according to claim 8 or 9, wherein the third lens surface is downwardly and outwardly inclined from the outer end of the second lens surface to the bottom surface of the lens.

* * * * *